(12) United States Patent
Inoue

(10) Patent No.: US 7,164,774 B2
(45) Date of Patent: Jan. 16, 2007

(54) AMPLIFIER WITH LIMITER

(75) Inventor: Takao Inoue, Saitama (JP)

(73) Assignee: Pioneer Corporation, Tokyo (JP)

( * ) Notice: Subject to any disclaimer, the term of this patent is extended or adjusted under 35 U.S.C. 154(b) by 447 days.

(21) Appl. No.: 10/243,871

(22) Filed: Sep. 16, 2002

(65) Prior Publication Data

US 2003/0059063 A1   Mar. 27, 2003

(30) Foreign Application Priority Data

Sep. 21, 2001   (JP) .................. P. 2001-289848

(51) Int. Cl.
*H03G 3/00*   (2006.01)
(52) U.S. Cl. ...................... 381/109; 381/104
(58) Field of Classification Search ................ 381/104, 381/107, 109, 106
See application file for complete search history.

(56) References Cited

U.S. PATENT DOCUMENTS

| | | | | |
|---|---|---|---|---|
| 4,320,254 A | * | 3/1982 | Tottori et al. ............... | 381/109 |
| 4,466,119 A | * | 8/1984 | Peters et al. ................ | 381/108 |
| 4,893,099 A | * | 1/1990 | Waller, Jr. ................. | 333/17.1 |
| 5,138,665 A | * | 8/1992 | Ito ............................. | 381/104 |
| 5,396,562 A | * | 3/1995 | Ishimitsu et al. ........... | 381/107 |
| 5,771,301 A | * | 6/1998 | Fuller et al. ................ | 381/107 |
| 5,892,834 A | * | 4/1999 | Smart et al. ................ | 381/106 |
| 2002/0057804 A1 | * | 5/2002 | Mellott ....................... | 381/15 |

FOREIGN PATENT DOCUMENTS

EP   0 964 512 A2   12/1999

OTHER PUBLICATIONS

European International Search Report of Appl. No. 02256076.7.

* cited by examiner

*Primary Examiner*—Brian T. Pendleton
(74) *Attorney, Agent, or Firm*—Drinker Biddle & Reath LLP

(57) ABSTRACT

A sound volume set-point value set by the variable resistor 1 is converted into a sound volume set-point value signal by a sound volume set-point value detecting section. A control signal generating section rectifies an input signal and adds it to a sound volume set-point value signal, thereby generating a control signal less fluctuated, and the amplification factor of amplifying section is adjusted by the control signal. The input signal is amplitude limited by this, to thereby prevent an output sound from being distorted. When the input signal is low in level, the amplitude limiting operation of the amplifier is stopped, to thereby retain a dynamic range of the original signal. Through the fluctuation suppression of the control signal, the unnatural feeling given to the listener when the amplitude limiting operation starts or stops is also lessened.

2 Claims, 8 Drawing Sheets

| SOUND VOLUME SET-POINT VALUE SIGNAL: LARGE | SOUND VOLUME SET-POINT VALUE SIGNAL: MEDIUM | SOUND VOLUME SET-POINT VALUE SIGNAL: SMALL |
|---|---|---|
|  |  |  |

AMPLIFIER WITH LIMITER

The present disclosure relates to the subject matter contained in Japanese Patent Application No.2001-289848 filed on Sep. 21, 2001, which is incorporated herein by reference in its entirety.

BACKGROUND OF THE INVENTION

1. Field of the Invention

The present invention relates to an amplifier with a limiter for amplifying an electric signal directly derived from an audio source, such as a reproducing device or a receiver.

2. Description of the Related Art

In an audio device according to the related art, such as a CD (compact disc) reproducing device or an FM broadcasting receiver, it is impossible to gain an electric signal for driving a speaker directly from an audio source. To cope with this, the audio device uses an audio amplifier for amplifying an electric signal derived from the audio source. In a general audio amplifier, as the signal output to the speaker increases, a distortion contained in the output signal increases. Accordingly, there is a limit in increasing the amplitude of the output signal, which is capable of driving the speaker with less distortion. When an excessive input signal is input to the audio amplifier, or a sound volume set by a sound volume adjusting knob is excessive, the amplitude of the output signal of the amplifier exceeds a limit level within which the speaker may be driven with no distortion, the output signal to the speaker is greatly distorted, and the speaker produces loud harsh sounds. An amplifier with a limiter or an amplifier with limiter is known in which to reduce such a distortion, a limiter circuit which limits an amplitude of an input signal to a speaker-driving power amplifier is provided at the input of the power amplifier.

In FIG. 6, a pre-stage amplitude limiting amplifier 101 with an ALC (auto limit control) circuit 100 as a limiter circuit is shown for an example of the amplifier with limiter. In FIG. 6, the amplifier 101 includes a pair of power amplifiers 105 which amplifies an electrical signal selectively taken out of different kinds of audio sources 102 to 104, such as a CD reproducing device, an MD (Mini Disc) reproducing device, and an FM broadcasting receiver, and the like. Those power amplifiers 105 drive speakers 106 associated therewith, respectively. The amplifier 101, which includes the power amplifiers 105, further includes a selector switch 107, ALC circuit 100, sound-volume adjusting variable resistor 108, and a fader 109. The selector switch 107 selects one of the audio sources 102 to 104, and allows a signal derived therefrom to pass therethrough. The ALC circuit 100 limits an amplitude of the electrical signal input thereto so that the output signals of the power amplifiers 105 are not greatly distorted. The sound-volume adjusting variable resistor 108 adjusts a sound volume of sounds produced from the speakers 106. The fader 109 adjusts a sound volume balance between the paired speakers 106 by adjusting a ratio of electric signals applied to the paired power amplifiers 105.

Where the amplifier 101 is used, even if an electric signal which is derived from one of the audio sources 102 to 104 and received by it is excessively large, the ALC circuit 100 operates to limit the amplitude of the electric signal. Accordingly, the output signals to the speakers are not greatly distorted, thereby preventing loud harsh sounds from being generated from the speakers in advance. The ALC circuit 100 of the amplifier 101 is provided at the pre-stage of the sound-volume adjusting variable resistor 108. In this sense, the amplifier 101 will be referred to as an "VR pre-stage amplitude limiting amplifier".

In FIG. 7, there is shown an amplifier 110 as another example of the amplifier with limiter. In the amplifier 110 of FIG. 7, the ALC circuit 100 of the pre-stage amplitude limiting amplifier 101 is located between the post-stage of the sound-volume adjusting variable resistor 108 and the pre-stage of the fader 109, while in the pre-stage amplitude limiting amplifier 101, ALC circuit 100 is located at the pre-stage of the sound-volume adjusting variable resistor 108. Thus, even if in the amplifier 110, a large electric signal is derived from one of the audio sources 102 to 104 in a state that a sound volume adjusting level set by the sound-volume adjusting variable resistor 108 is large, an amplitude of the electric signal to be input to the power amplifiers 105 is limited by the ALC circuit 100. Accordingly, as in the pre-stage amplitude limiting amplifier 101 already described, the output signals to the speakers are not greatly distorted, thereby preventing loud harsh sounds from being generated from the speakers in advance. The ALC circuit 100 of the amplifier 110 is provided at the post-stage of the sound-volume adjusting variable resistor 108. In this sense, the amplifier 110 will be referred to as a "VR post-stage amplitude limiting amplifier".

In FIG. 8, there is shown an amplifier 120 as yet another example of the amplifier with limiter. In the amplifier 120 of FIG. 8, the ALC circuit 100A is provided at the post-stage of the fader 109, while the ALC circuit 100 is provided at the pre-stage of the sound-volume adjusting variable resistor 108 in the pre-stage amplitude limiting amplifier 101 already described. In the ALC circuit 100A, ALC circuits 100 are provided in association with the paired power amplifiers 105, respectively. Even if in the amplifier 120, as in the amplifier 110 already described, a large electric signal comes from one of the audio sources 102 to 104 in a state that a sound volume adjusting level set by the sound-volume adjusting variable resistor 108 is large, amplitudes of the electric signals to be input to the power amplifiers 105 are limited by the ALC circuits 100. Accordingly, the output signals to the speakers are not greatly distorted, thereby preventing loud harsh sounds from being generated from the speakers in advance. The ALC circuit 100 of the amplifier 120 is provided at the post-stage of the fader 109. In this sense, the amplifier 110 will be referred to as a "fader post-stage amplitude limiting amplifier".

In the VR pre-stage amplitude limiting amplifier, the electric signal as an original signal derived from the audio source is directly limited in amplitude. Even in such a case where a sound volume adjusting level set by the sound-volume adjusting variable resistor is small, and there is no chance that the output signals from the power amplifiers are greatly distorted, the amplitudes of the electric signals to be amplified by the power amplifiers are all compressed to be a signal of which the amplitude is within a predetermined width. This results in suppression of the dynamic range of the original signal.

In the VR post-stage amplitude limiting amplifier, the electric signal of which the sound-volume adjusting level is adjusted by the sound-volume adjusting variable resistor is amplitude-limited. Therefore, if the sound-volume adjusting level as set is sufficiently small, the dynamic range of the original signal is not impaired. When the sound-volume adjusting level set by the sound-volume adjusting variable resistor is large to some extent, and such an input signal that the maximum amplitude is considerably larger than the minimum amplitude is input to the VR post-stage amplitude limiting amplifier, the operation of the ALC circuit cannot follow up a rapid variation of the electric signal. Accordingly, when the amplitude limiting operation starts and stops, a listener feels a sense of incongruity.

To be more specific, there is a case where an electric signal having a large dynamic range is rapidly varied from a large signal level requiring the amplitude limit to a small signal level not requiring the same, or where the user rapidly reduces a sound volume. In such a case, the amplitude limiting operation of the ALC circuit is stopped in retard of a variation of the electric signal. Further, the compression operation is completely and rapidly removed in a state that substantially the same amplitude of the electric signal continues. Accordingly, an unnatural sound is generated. Conversely, in the case where the electric signal is rapidly varied from a small signal level not requiring the amplitude limit to a large signal level requiring the same, for example, when the user rapidly increases a sound volume, the amplitude limiting function of the ALC circuit starts to be active in retard of a variation of the electric signal. Also in this case, the electric signal is rapidly and greatly compressed in a state that substantially the same amplitude of the electric signal continues. Accordingly, an unnatural sound is generated. In the case of the ALC circuit in which the amplitude limiting operation is started and stopped following up only the electric signal as input, it is difficult to start or stop the amplitude limiting operation in time for an amplitude variation of the electric signal. Accordingly, it is difficult to improve the unnatural feeling of sound generated.

In the case of the fader post-stage amplitude limiting amplifier, when it receives an electric signal of a large dynamic range, the operation of the ALC circuit cannot follow up a rapid variation of the electric signal as in the VR post-stage amplitude limiting amplifier. Accordingly, when the amplitude limiting operation is started or stopped, the listener is given the unnatural feeling. Additionally, the ALC circuits which correspond in number to the power amplifiers are required. The result is that the number of parts of the whole device is increased, and assembling work and adjusting work are complicated and cumbersome.

SUMMARY OF THE INVENTION

An object of the present invention is to provide an amplifier with limiter in which even if an input signal is amplitude limited in order to remove the distortion of an output sound, the suppression of the dynamic range of an original signal is lessened, and the unnatural feeling given to the listener when the amplitude limiting operation starts or stops is also lessened.

According to the present invention, there is provided an amplifier with limiter for amplifying an input signal of an audio frequency band comprising: sound volume adjusting section for setting a sound volume level of the input signal, sound volume set-point value detecting section for outputting a sound volume set-point value signal which is based on the sound volume set-point value set by the sound volume adjusting section, amplifying section which receives a control signal for adjusting an amplification factor thereof, and amplifies the input signal at an amplification factor based on the control signal; and control signal generating section for generating the control signal on the basis of the sound volume set-point value signal.

In the amplifier with limiter of the invention, the sound volume set-point value detecting section detects a sound volume set-point value set by the sound volume adjusting section for adjusting the sound volume of the speakers, and outputs the sound volume set-point value signal based on the detected sound volume set-point value. The control signal generating section generates the control signal by adding the input signal as an original signal to the sound volume set-point value signal. The amplifying section amplifies the input signal while the amplification factor of the amplifying section is adjusted by the control signal. Therefore, when the large input signal is input or the sound volume level set by the sound volume adjusting section is large, the amplification factor of the amplifying section is decreased. As a result, the input signal amplitude is sufficiently limited, and an output signal of the power amplifier for driving the speakers is prevented from being greatly distorted. When the small input signal is input or the sound volume set by the sound volume adjusting section is small, the amplification factor of the amplifying section is sufficiently increased. Therefore, the amplitude of the electric signal to be amplified by the power amplifier is little compressed, and the suppression of the dynamic range of the original signal is lessened. Further, when the input signal of a large dynamic range is input, and the input signal is rapidly varied from a large signal level requiring the amplitude limit to a small signal level not requiring the same, part of the amplification factor of the amplifying section, which corresponds to the sound volume level set by the sound volume adjusting section, is not decreased. As a result, the compressing operation is partially removed, and the unnatural feeling given to the listener when the amplitude limiting operation stops is lessened. Conversely, when the input signal is rapidly varied from a small signal level not requiring the amplitude limit to a large signal level requiring the same, the increase of the amplification factor of the amplifying section is within a partial increase corresponding to a variation of the input signal. Accordingly, there is no chance that the input signal is greatly compressed, and the unnatural feeling given to the listener when the amplitude limiting operation starts is lessened.

In the amplifier with limiter, the control signal generating section generates the control signal by adding an input level signal produced by rectifying the input signal to the sound volume set-point value signal. Thus, the input signal as a constantly varying AC signal is rectified. Accordingly, the resultant input signal is matched to the sound volume set-point value signal as a DC signal, which does not vary except when the sound volume is set. As a result, the control signal which is appropriate to the controlling of the amplification factor of the amplifying section is produced, the amplification factor control of the amplifying section is stable, and the amplitude to be limited is not greatly varied. Also in this respect, the unnatural feeling of the sounds output from the speakers is also lessened.

Preferably, the amplifier with limiter further comprises control signal selecting section for outputting only a control signal having a predetermined level or higher to the amplifying section. If so constructed, when the input signal level is small or the amplitude limit is not required since the sound volume level as set by the sound volume adjusting section is small, the control signal fails to reach a predetermined level, and the control signal selecting section prohibits the control signal from going to the amplifying section. As a result, the amplitude limiting of the input signal is not carried out, and the dynamic range of the input signal as the original signal is retained.

According to the invention, there is provided amplification method for amplifying an input signal of an audio frequency band, the method including the steps of setting a sound volume level of the input signal, outputting a sound volume set-point value signal, which is based on the sound volume set-point value, receiving a control signal for adjusting an amplification factor thereof, amplifying the input signal at an amplification factor based on the control signal, and generating the control signal based on the sound volume set-point value signal.

BRIEF DESCRIPTION OF THE PREFERRED EMBODIMENTS

DETAILED DESCRIPTION OF THE PREFERRED EMBODIMENTS

Figure 1:
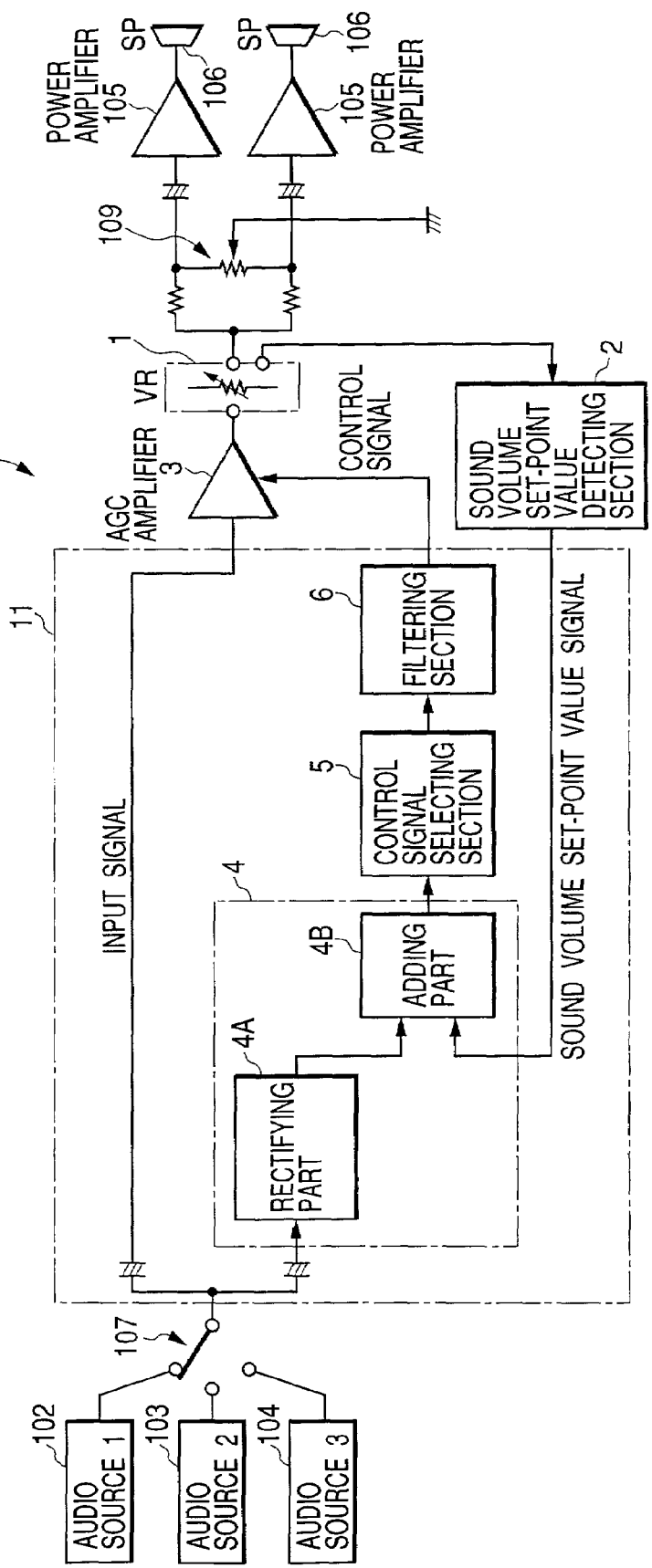
FIG. 1 is a block diagram showing an arrangement of a first embodiment of the invention.

The preferred embodiments of the present invention will be described with reference to the accompanying drawings. In the description to be given hereunder, parts, which are already described, are designated by like reference numerals used in the related description for ease of explanation. FIG. 1 is a diagram schematically showing a circuit arrangement of an amplifier with limiter 10 according to a first embodiment of the invention. In FIG. 1, the amplifier with limiter 10 is an on-vehicle monaural amplifier, which amplifies an input signal of the audio frequency band to drive speakers 106. The amplifier with limiter 10 includes a variable resistor 1, a sound volume set-point value detecting section 2, an amplifying section 3 and a pre-processing section 11. The variable resistor 1 is a sound volume adjusting section, which sets a sound volume level to adjust a sound volume of the speakers 106. The sound volume set-point value detecting section 2 detects a sound volume set-point value set by the variable resistor 1 for adjusting the sound volume of the speakers 106. The amplifying section 3 is provided at the pre-stage of the variable resistor 1, and amplifies an input signal derived from one of audio sources 102 to 104. The pre-processing section 11 executes predetermined processes on input signals to be input to the amplifying section 3.

When the amplifying section 3 amplifies the input signal thereto, the pre-processing section 11 causes the amplifying section 3 to limit its output signal amplitude so that the output signals of the power amplifiers 105 are not distorted. The pre-processing section 11 includes a control signal generating section 4, a control signal selecting section 5 and a filtering section 6. The control signal generating section 4 generates a control signal for controlling an amplification factor of the amplifying section 3, and causes the amplifying section 3 to amplify the input signal at an amplification factor based on the generated control signal. The control signal generating section 4 generates a control signal on the basis of the input signal and a sound volume set-point value signal. The control signal selecting section 5 allows only those control signals of a predetermined signal level or higher to go to the amplifying section 3. The filtering section 6 suppresses fluctuations of the control signal. The control signal generating section 4 includes a rectifying part 4A, which rectifies the input signal and generates an input level signal, and an adding part 4B, which generates a control signal by adding the input level signal to a sound volume set-point value signal.

When the sound volume set-point value detecting section 2 detects the sound volume set-point value set by the variable resistor 1, it outputs a sound volume set-point value signal, which depends on the detected sound volume set-point value. For example, a tandem type resistor may be used for the variable resistor 1. This type resistor has a combination of a resistive member and two movable contacts, which slide on the surface of the resistive member and are interlocked with each other. Where the tandem type resistor is used, the sound volume of each speaker 106 is adjusted by one movable contact, and the sound volume set-point value is detected by the other movable contact. Further, the sound volume set-point value signal is generated when a predetermined DC voltage is applied to the movable contact used for detecting the sound volume set-point value, by the sound volume set-point value detecting section 2.

Figure 2:
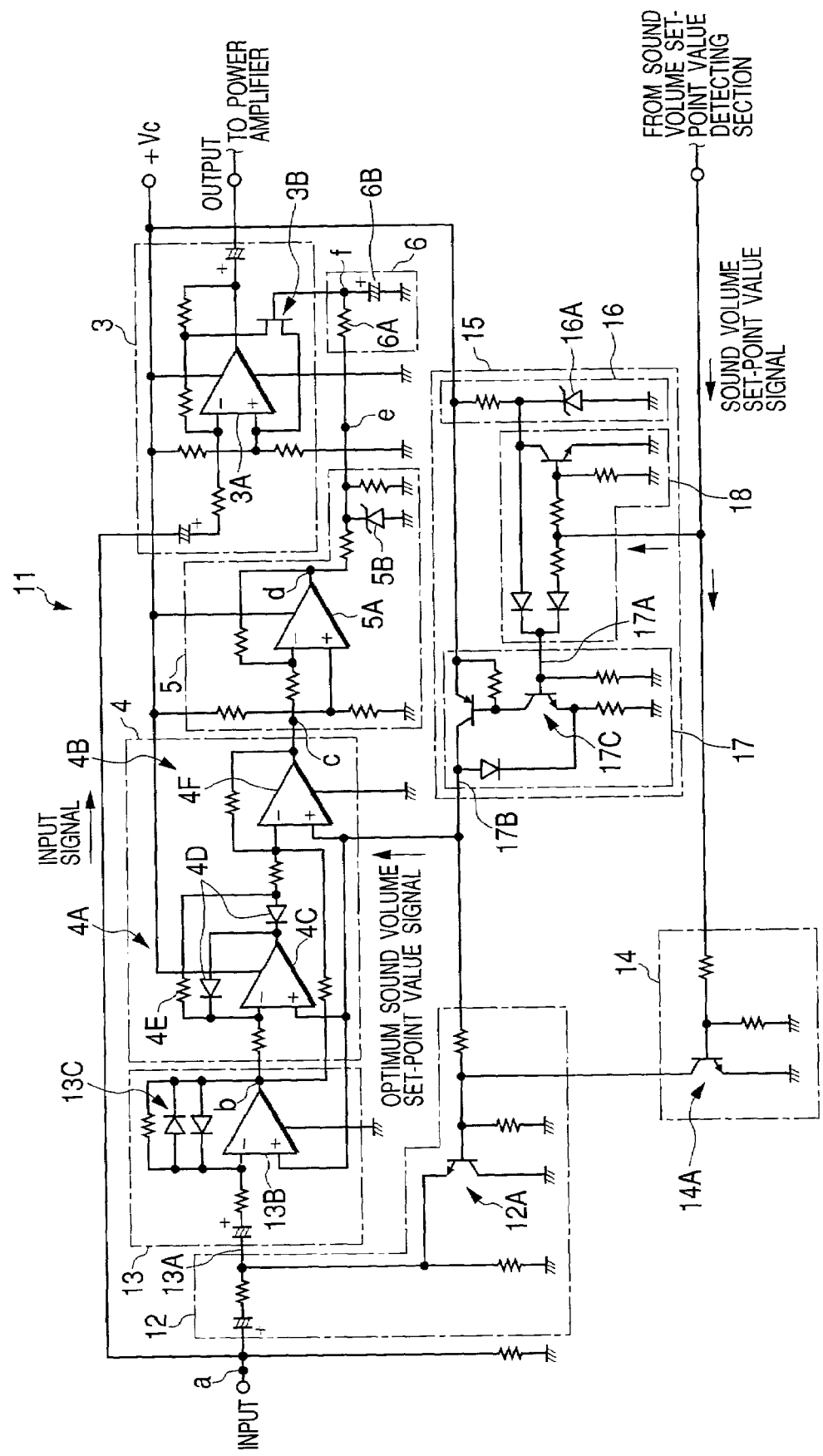
FIG. 2 is a circuit diagram showing a key portion of the first embodiment.

The pre-processing section 11 will be described in more detail. An amplitude-limit region and a non-amplitude-limit region are preset in the pre-processing section 11. In the amplitude-limit region, the sound volume set-point value signal generated by the sound volume set-point value detecting section 2 is limited between a predetermined level and a maximum level. In the non-amplitude-limit region, the signal is limited between a minimum level and the predetermined level. Only when the sound volume set-point value signal is within the amplitude-limit region, the pre-processing section 11 permits the amplifying section 3 to perform the amplitude limiting operation. Specifically, as shown in FIG. 2, the pre-processing section 11 further includes an input suppressing section 12 for suppressing the input signal, a clipping section 13 for limiting an excessive amplitude of the input signal, an input suppression controlling section 14 for turning on and off the input suppressing section 12, and a level converting section 15 for converting the sound volume set-point value signal level to a signal level which is suitable for the control signal generating section 4, in addition to the control signal generating section 4, the control signal selecting section 5, and the filtering section 6.

When the sound volume set-point value signal is within the non-amplitude-limit region, the input suppressing section 12 suppresses the input signal such that it makes a transistor 12A conductive, lowers a potential at the input part 13A of the clipping section 13, and prohibits an input signal from going to the clipping section 13. When the sound volume set-point value signal is within the amplitude-limit region, the transistor 12A is turned off, the potential at the input part 13A of the clipping section 13 is sustained, and the input signal is allowed to go to the clipping section 13.

The clipping section 13 includes a clipping diode 13C in a feedback path of an operational amplifier 13B. When receiving the input signal at a predetermined level or higher, the clipping section 13 cuts out a part of the input signal waveform which is present in excess of a set level, by a clipping diode 13C, and instantaneously converts the signal to a signal of an amplitude smaller than a predetermined amplitude, and outputs the resultant signal. Through the operation, an input signal of excessive level is not input to the input suppression controlling section 14 and the subsequent ones, the control signal produced by the control signal generating section 4 is not greatly fluctuated, and the amplification factor of the amplifying section 3 is not varied needlessly.

The input suppression controlling section 14 includes a transistor 14A which is turned on when the sound volume set-point value signal coming from the sound volume set-point value detecting section 2 increases and its level falls within the amplitude-limit region, and is turned off when the sound volume set-point value signal decreases and its level falls within the non-amplitude-limit region. Responding to the on/off operation of the transistor 14A, the transistor 12A operates, and the on/off control of the input suppressing section 12 is carried out.

The control signal generating section 4 includes an operational amplifier 4C, as the rectifying part 4A, for full-wave rectifying the input signal having passed through the clipping section 13, a diode 4D, a DC resistor 4E and an operational amplifier 4F, as the adding part 4B, for adding the input level signal from the rectifying part 4A and the sound volume set-point value signal.

The control signal selecting section 5 includes an inverting amplifier 5A inverting the control signal from the control signal generating section 4, and a Zener diode 5B which controls the inverted control signal such that when an output potential of the inverting amplifier 5A reaches a predetermined level, the Zener breakdown phenomenon occurs in the Zener diode 5B, so that the inverted control signal is prevented from increasing to be in excess of a predetermined level. The control signal selecting section 5 thus constructed inverts the control signal, and outputs such an inverted control signal that when the control signal is below a predetermined level, it is increased to the maximum level, and as the control signal increases and exceeds the predetermined level, its level gradually decreases from the maximum level. The filtering section 6 is a filter circuit which removes a ripple component from the inverted control signal output from the control signal selecting section 5 by using a DC resistor 6A and a capacitor 6B.

The amplifying section 3 amplifies the input signal by an operational amplifier 3A, and an amplification factor varies depending on the voltage of the inverted control signal which is applied to a gate of an FET 3B. To be more specific, the amplifying section 3 is designed such that the amplification factor of the operational amplifier 3A varies from the minimum value to the maximum value as the gate voltage of the FET 3B, i.e., the inverted control signal, increases in level within a predetermined range. Accordingly, when the control signal output from the control signal generating section 4 is at the predetermined level or lower, the amplification factor of the operational amplifier 3A takes the maximum value, and the amplifying section 3 does not compress the input signal. As the control signal increases in level from the predetermined level, the amplification factor of the operational amplifier 3A decreases to the minimum value, and the amplifying section 3 gradually compresses the input signal to thereby limit the amplitude of it.

The level converting section 15 outputs the midpoint voltage signal generated therewithin to an operational amplifier 13B of the clipping section 13 and the operational amplifiers 4C and 4F of the control signal generating section 4 when the sound volume set-point value signal is within the non-amplitude-limit region. The level converting section 15 regulates and outputs the sound volume set-point value signal to the operational amplifier 13B of the clipping section 13 and the operational amplifiers 4C and 4F of the control signal generating section 4 when the sound volume set-point value signal is within the amplitude-limit region.

The level converting section 15 includes a midpoint-voltage signal generating circuit 16, a signal processing circuit 17 and a selection circuit 18. The midpoint-voltage signal generating circuit 16 generates a midpoint voltage signal whose voltage is kept at constant level by a Zener diode 16A. The signal processing circuit 17 receives, at an input part 17A, one of the sound volume set-point value signal from the sound volume set-point value detecting section 2 and the midpoint voltage signal, and outputs to a output part 17B a voltage signal based on the signal as input. The selection circuit 18 selects one of the sound volume set-point value signal and the midpoint voltage signal, and inputs the selected signal to the signal processing circuit 17.

The selection circuit 18 inputs the midpoint voltage signal to the signal processing circuit 17 when the sound volume set-point value signal is within the non-amplitude-limit region, and inputs the sound volume set-point value signal to the signal processing circuit 17 when the sound volume set-point value signal is within the amplitude-limit region. When receiving the sound volume set-point value signal, the signal processing circuit 17 converts the input sound volume set-point value signal to an optimum sound volume set-point value signal which is acceptable for the control signal generating section 4, by a transistor 17C. When receiving the midpoint voltage signal, the signal processing circuit 17 applies an optimum midpoint voltage to the rectifying part 4A of the control signal generating section 4.

Figure 3A:
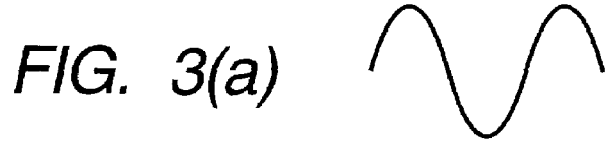
FIG. 3 is a diagram showing signal waveforms useful in explaining operation of the first embodiment.
Figure 3B:
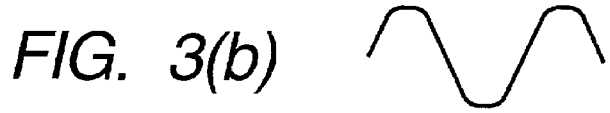
Figure 3C:

In the embodiment thus constructed, as shown in FIG. 3(a), a sinusoidal input signal is input to a point "a" in FIG. 2, and the input signal passes through the clipping section 13. The clipping section 13 clips the input signal at a preset level to remove the parts of the input signal waveform present in excess of the preset level. As a result, the signal appearing at a point "b" in FIG. 2 takes a trapezoidal waveform as shown in FIG. 3(b). The input signal of which the waveform is shaped into a trapezoidal waveform is subjected to the rectifying process and the adding process in the control signal generating section 4. A control signal as shown in FIG. 3(c) appears at a point "c" in FIG. 2. A waveform of the control signal is shaped such that a part of the input signal waveform, which is curved toward the minus side, is turned up to the plus side. The control signal is biased by an amount of the sound volume set-point value signal.

Figure 3D:
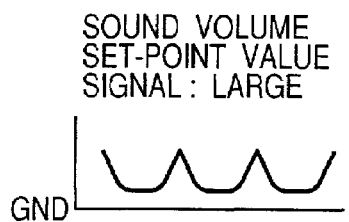
Figure 3D:
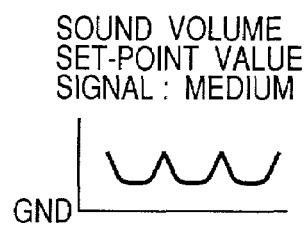
Figure 3D:
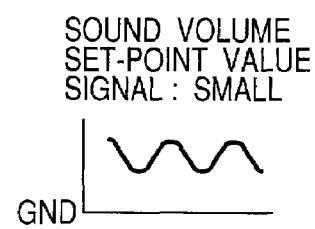
Figure 3E:
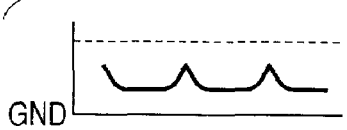
Figure 3E:
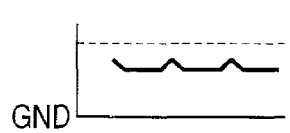
Figure 3E:
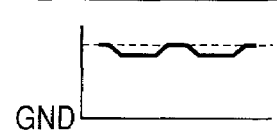

When receiving the control signal, the control signal selecting section 5 inverts the control signal, and an inverted signal of the control signal appears at a point "d" in FIG. 2, as shown in FIG. 3(d). At this time, the biased part of the sound volume set-point value signal is also inverted. As the sound volume set-point value signal increases, a level of the whole waveform decreases, while as the sound volume set-point value signal decreases, the level of the whole waveform increases. The Zener diode 5B of the control signal selecting section 5 cuts out the parts of the waveform of the inverted signal that are present above a predetermined level, and allows only the remaining parts of the waveform to pass therethrough. As a result, as shown in FIG. 3(e), the inverted control signal having a waveform of which the amplitude is below the predetermined level, appears at a point "e" in FIG. 2.

Figure 3F:
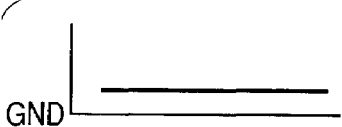
Figure 3F:
Figure 3F:
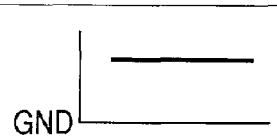

The inverted control signal passes through the filtering section 6. At this time, a ripple component of it is removed. As a result, a control voltage signal of which the waveform is flat and containing no ripple, appears at a point "f" in FIG. 2, as shown in FIG. 3(f). The control voltage level decreases as the sound volume set-point value signal increases, while it increases as the sound volume set-point value decreases.

Figure 4:
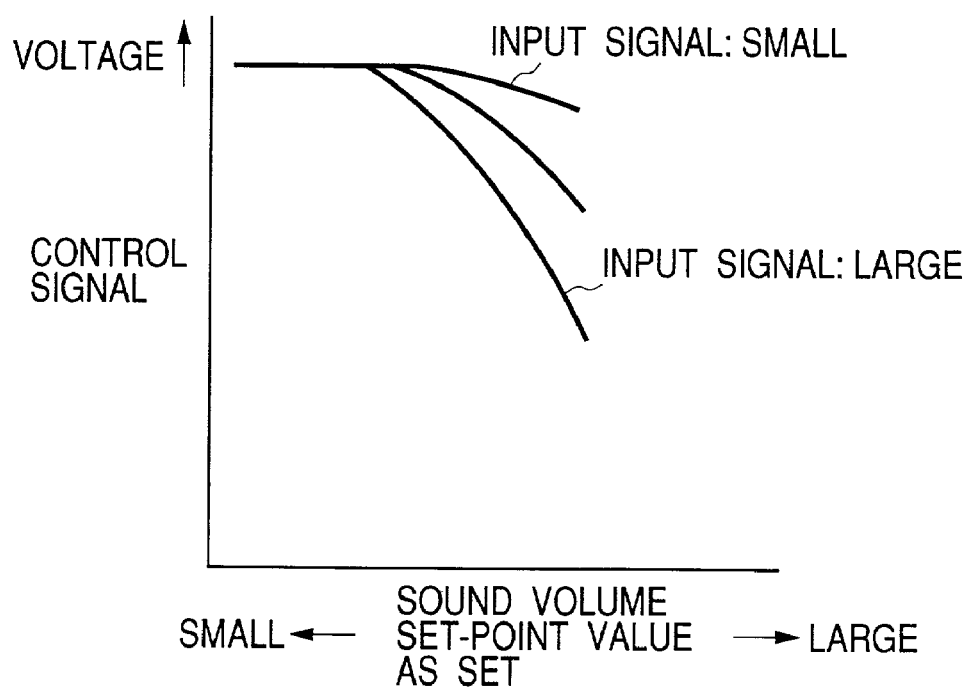
FIG. 4 is a graph useful in explaining operation of the first embodiment.

When the input signal is small, the control voltage signal less decreases in voltage level even if the sound volume set-point value signal goes large, and the amplification factor of the amplifying section 3 decreases less (FIG. 4). As a result, the amplitude limiting operation of the amplifying section 3 is made inactive. Conversely, when the input signal is large, the control voltage signal remarkably decreases in voltage level as the sound volume set-point value signal goes large, and the amplification factor remarkably decreases. As a result, the amplitude limiting operation of the amplifying section 3 is made active.

The first embodiment described above has the following useful effects. The sound volume set-point value detecting section 2 detects a sound volume set-point value of the variable resistor 1 for adjusting the sound volume of the speakers 106. The sound volume set-point value signal based on the detected sound volume set-point value is input to the control signal generating section 4. The sound volume set-point value signal and the input signal are added together to generate a control signal. The amplifying section 3 amplifies the input signal while the amplification factor of the amplifying section 3 is adjusted by the control signal. Therefore, when the large input signal is input or the sound volume level is large, the amplification factor of the amplifying section 3 is decreased. As a result, the input signal amplitude is limited, and the sounds output from the speakers 106 are prevented from being greatly distorted.

When the small input signal is input or the sound volume set by the sound volume adjusting section is small, the lowering of the amplification factor of the amplifying section 3 is decreased. Therefore, the amplitude of the electric signal to be amplified by the power amplifier 105 is little compressed, and the suppression of the dynamic range of the original signal is lessened.

Further, when the input signal of a large dynamic range is input, and the input signal is rapidly varied from a large signal level requiring the amplitude limit to a small signal level not requiring the same, part of the amplification factor of the amplifying section 3, which corresponds to the sound volume level set by the variable resistor 1, is not decreased. As a result, the compressing operation is partially stopped, and the unnatural feeling given to the listener when the amplitude limiting operation stops is lessened. Conversely, when the input signal is rapidly varied from a small signal level not requiring the amplitude limit to a large signal level requiring the same, the increase of the amplification factor of the amplifying section 3 is within a partial increase corresponding to a variation of the input signal. Accordingly, there is no chance that the input signal is greatly compressed, and the unnatural feeling given to the listener when the amplitude limiting operation starts is also lessened.

The control signal generating section 4 is used which rectifies an input signal as a constantly varying AC signal, and adds the input level signal produced by the rectification to the sound volume set-point value signal, to thereby generate a control signal. The input signal as an AC signal is matched to the sound volume set-point value signal as a DC signal, which does not vary except when the sound volume is set. As a result, the control signal which is appropriate to the controlling of the amplification factor of the amplifying section 3, is produced, and the amplification factor control of the amplifying section 3 is stable, and the amplitude to be limited is not varied needlessly. Also in this respect, the unnatural feeling of the sounds output from the speakers 106 is also lessened.

The control signal selecting section 5, which permits only the control signal of a predetermined signal level or higher to pass to the amplifying section, is provided between the control signal generating section 4 and the amplifying section 3. When the input signal level is small or the amplitude limit is not required since the sound volume level as set by the variable resistor 1 is small, the control signal fails to reach a predetermined level, and the control signal selecting section 5 makes the control signal invalid. As a result, the amplitude limiting of the input signal is not carried out, and the dynamic range of the input signal as the original signal is retained.

The filtering section 6 which suppresses a fluctuation of the control signal is provided between the control signal generating section 4 and the amplifying section 3, to thereby remove the ripple component contained in the input level signal, which is formed by rectifying the input signal as the AC signal. The result is that an unwanted variation of the control signal input to the amplifying section 3 is suppressed, the amplification factor control of the amplifying section 3 is stable, the amplitude to be limited is not fluctuated, and an unnatural feeling of sounds generated by the speakers 106 is lessened.

Further, the variable resistor 1 is used for the sound volume adjusting section, and the sound volume set-point value detecting section 2 is used which converts a position of the movable contact of the variable resistor 1 into an electric signal as a sound volume set-point value signal. Provision of those components reduces the distortion of the output sound generated by a general audio device of the type in which a sound volume is adjusted by use of a sound volume knob for operating the variable resistor 1. Further, even if the output sound distortion performance is improved, the dynamic range of the original signal is not impaired, and the unnatural feeling given to the listener when the amplitude limiting operation starts or stops is lessened.

Figure 5:
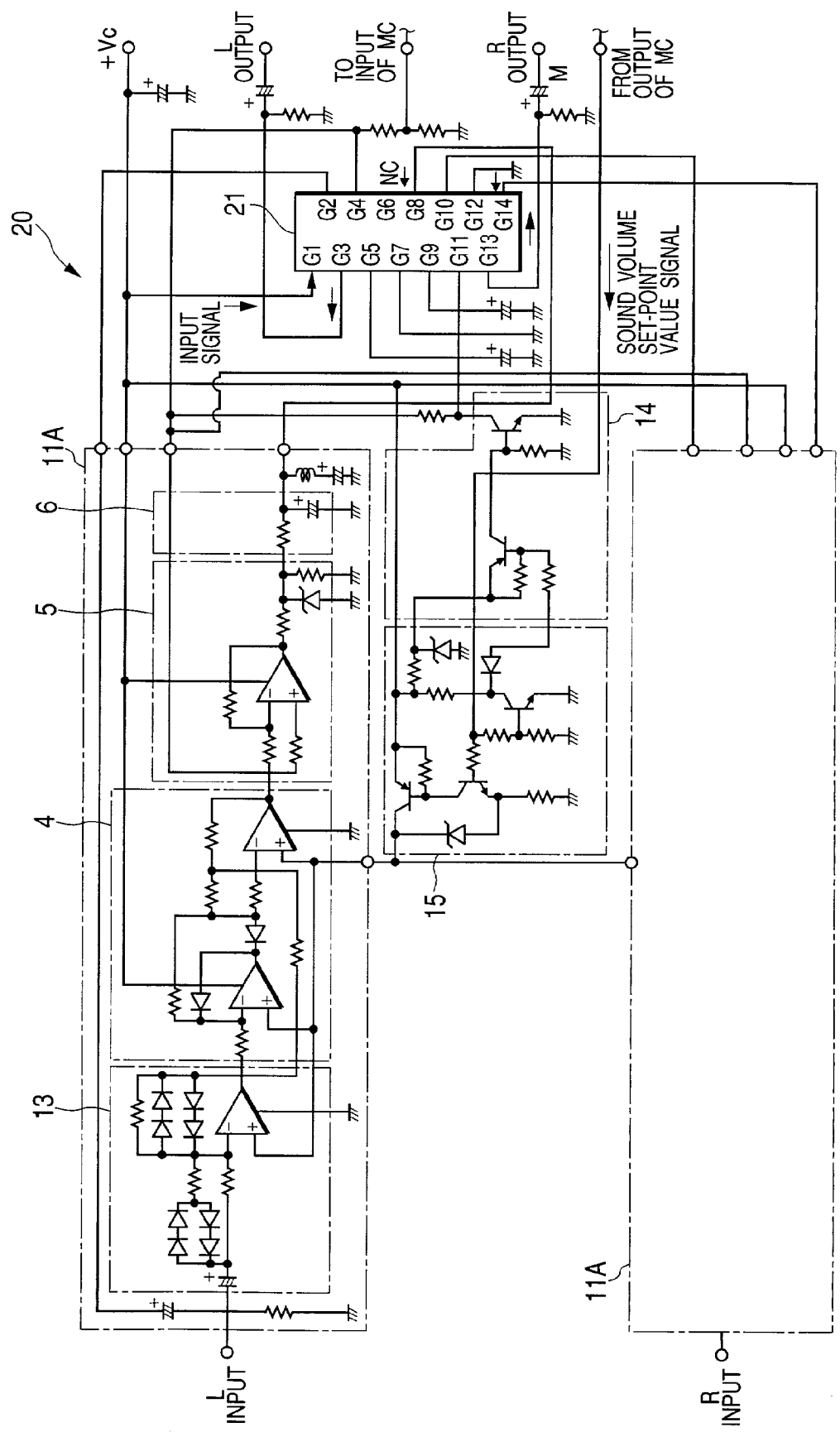
FIG. 5 is a circuit diagram showing a key portion of a second embodiment of the invention.
Figure 6:
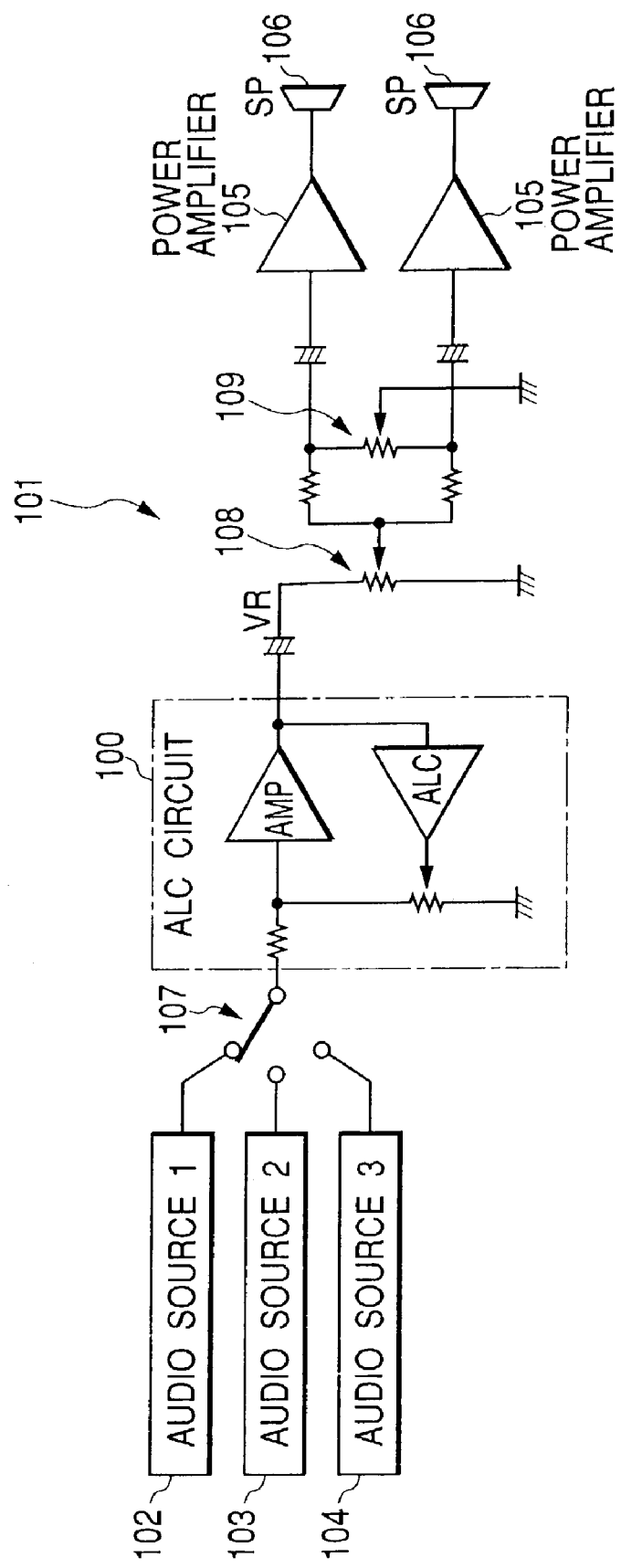
FIG. 6 is a block diagram showing an arrangement of a device according to the related art.
Figure 7:
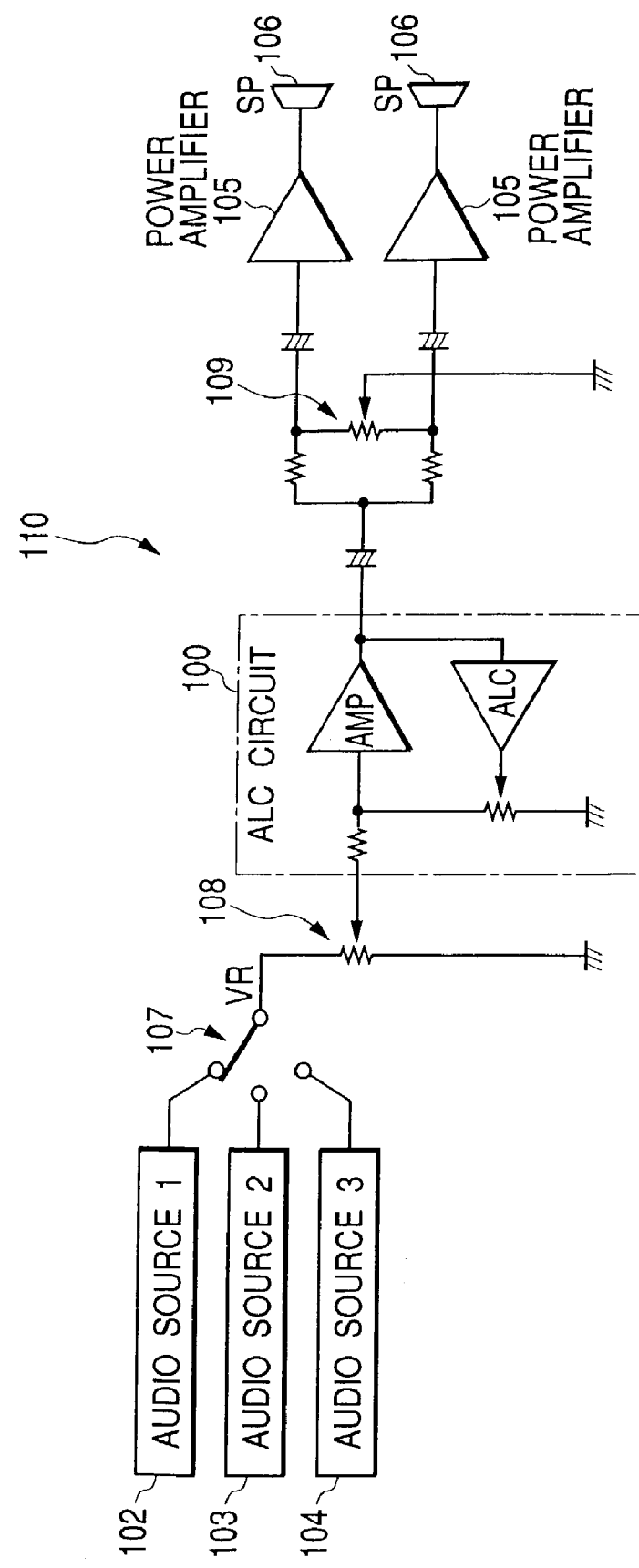
FIG. 7 is a block diagram showing an arrangement of another device according to the related art.
Figure 8:
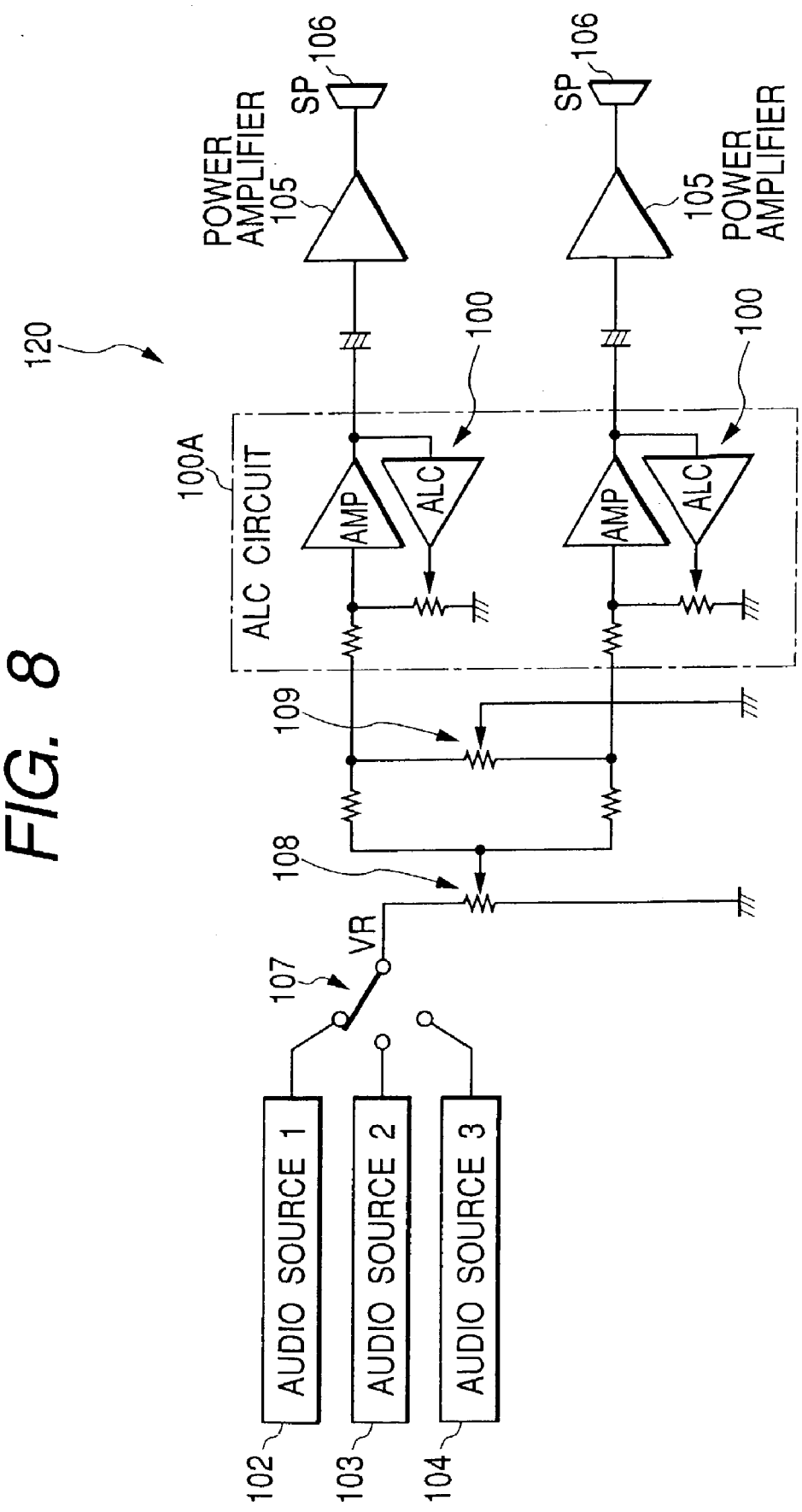
FIG. 8 is a block diagram showing an arrangement of yet another device according to the related art.

FIG. 5 shows a key portion of an amplifier with limiter 20 according to a second embodiment of the present invention. In the second embodiment, an electronic volume 21 formed with a one-chip IC is used in place of the amplifying section 3 containing an operational amplifier 3A, which is used in the first embodiment. In FIG. 5, the amplifier with limiter 20 is a stereo amplifier which amplifiers an input signal of the audio frequency band and drives speakers 106 by the input signal, and contains two pre-processing section 11A each corresponding to the pre-processing section 11 in the first embodiment. One of those pre-processing section 11A is used for the left channel, and the other is for the right channel.

The amplifier with limiter 20 includes a microcomputer (abbreviated as "MC), not shown, as sound volume adjusting section. The MC decodes a sound-volume operation signal of a remote controller or the like, and adjusts a sound volume of each speaker 106. The MC also serves as sound volume set-point value detecting section for detecting a sound volume set-point value as set.

The electronic volume 21 is an amplifying section for amplifying independently a left-channel input signal and a right-channel input signal, and is provided with a plurality of gates G1 to G14. Of those gates G1 to G14, the gate G1 is an input terminal for a power source voltage. The gate G2 is an input terminal for inputting a left-channel input signal. The gate G3 is an output terminal for the left-channel input signal. The gate G8 is an input terminal for inputting a left-channel, inverted control signal. The gate G10 is an input terminal for inputting a right-channel, inverted control signal. The gate G11 is an input terminal for inputting an amplitude-limit signal for causing the electronic volume 21 to perform an amplitude-limit control operation. The gate G13 is an output terminal for the right-channel input signal. The gate G14 is an input terminal for inputting a left-channel input signal.

An amplitude limit signal, which comes from the input suppression controlling section 14, is input to the gate G11 of the electronic volume 21. When a sound volume set-point value signal which comes from the sound volume set-point value detecting section 2 rises and its amplitude level falls within the amplitude-limit region, the amplitude limit signal of the input suppression controlling section 14 is placed to a high state. When the sound volume set-point value signal falls and its amplitude level falls within the non-amplitude-limit region, the amplitude limit signal is placed to a low state. When the amplitude limit signal of high state is input to the gate G11, the electronic volume 21 limits the amplitude of each channel signal according to the inverted control signal applied to the gates G8 and G14. When the amplitude limit signal of low state is input to the gate G11, the electronic volume cancels the inverted control signal input to the gates G8 and G14, and stops the amplitude limiting operation. Accordingly, there is no need of using the input suppressing section 12, and the input suppressing section 12 is not used in the pre-processing section 11A.

The second embodiment also produces the useful effects similar to those of the first embodiment, and operates as in the first embodiment. The present embodiment further produces the following useful effects. The embodiment includes the MC having an adjusting function for adjusting a sound volume of the speaker for the sound volume adjusting section and the sound volume set-point value detecting section, and further the electronic volume 21 being capable of adjusting the amplitude of the input signal according to the control signal, for the amplifying section. Even in an audio device which is not provided with a sound volume control means to adjust a sound volume by an infrared remote controller, its output sound distortion performance is improved. Even if the output sound distortion performance is improved, the dynamic range of the original signal is not impaired, and the unnatural feeling given to the listener when the amplitude limiting operation starts or stops is lessened.

It should be understood that the present invention is not limited to the embodiments mentioned above, but may be modified in the following ways. As for the amplifying section and the sound volume adjusting section, the sound volume adjusting section is connected to the output of the amplifying section in the first embodiment. In alternative, the sound volume adjusting section is connected to the input of the amplifying section in the first embodiment. Where the sound volume adjusting section is connected to the input of the amplifying section, the sound signal is varied when the sound volume adjusting section is operated, viz., such a variation factor must additionally be taken into consideration. A measure to prevent the variation factor from affecting the amplitude limiting operation, when taken, makes the control complicated. However, where the sound volume adjusting section is connected to the output of the amplifying section as in the first embodiment, the overall circuitry is simplified.

The amplifier with limiter may be applied not only to a on-vehicle amplifier, but also to home- and business-use amplifier. The audio source is not limited to the audio device, such as CD reproducing device, MD (Mini Disc) reproducing device, FM broadcasting receiver, or the like, but may be a voice to electric signal converting device, such as a microphone, such an electric musical instrument as a guitar, and such an electronic musical instrument as an electronic organ.

As seen from the foregoing description, even if an input signal is amplitude limited in order to remove the distortion of an output sound, the suppression of the dynamic range of an original signal is lessened, and the unnatural feeling given to the listener when the amplitude limiting operation starts or stops is also lessened.

What is claimed is:

1. An amplifier with limiter for amplifying an input signal of an audio frequency band, the amplifier comprising:
    a sound volume adjusting section for setting a sound volume level of the input signal;
    a sound volume set-point value detecting section for outputting a sound volume set-point value signal, which is based on the sound volume set-point value set by the sound volume adjusting section;
    an amplifying section, which receives a control signal for adjusting an amplification factor thereof and amplifies the input signal at an amplification factor based on the control signal, the amplifying section being a pre-stage of the sound volume adiusting section;
    a control signal generating section for generating the control signal based on the sound volume set-point value signal; and
    a control signal selecting section for outputting only the control signal having a predetermined signal level or higher to the amplifying section.

2. The amplifier with limiter according to claim 1, wherein the control signal generating section generates the control signal by adding an input level signal produced by rectifying the input signal to the sound volume set-point value signal.

* * * * *